(12) United States Patent
Krüger et al.

(10) Patent No.: US 7,196,382 B2
(45) Date of Patent: Mar. 27, 2007

(54) TRANSISTOR, METHOD FOR PRODUCING AN INTEGRATED CIRCUIT AND A METHOD OF PRODUCING A METAL SILICIDE LAYER

(75) Inventors: Dietmar Krüger, deceased, late of Frankfurt (DE); by Elena Krüger, legal representative, Frankfurt (DE); Andriy Goryachko, Frankfurt (DE); Rainer Kurps, Frankfurt (DE); Jing Ping Liu, Frankfurt (DE); Hans-Jörg Osten, Frankfurt (DE)

(73) Assignee: IHP GmbH Innovations for High Performance Microelectronics/Institut fur Innovative Mikroelektronik, Frankfurt (DE)

( * ) Notice: Subject to any disclaimer, the term of this patent is extended or adjusted under 35 U.S.C. 154(b) by 0 days.

(21) Appl. No.: 10/479,300

(22) PCT Filed: May 24, 2002
(Under 37 CFR 1.47)

(86) PCT No.: PCT/EP02/05773
§ 371 (c)(1),
(2), (4) Date: Apr. 5, 2005

(87) PCT Pub. No.: WO02/097895
PCT Pub. Date: Dec. 5, 2002

(65) Prior Publication Data
US 2005/0227466 A1 Oct. 13, 2005

(30) Foreign Application Priority Data
May 26, 2001 (DE) .............................. 101 27 234
Nov. 12, 2001 (DE) .............................. 101 55 915

(51) Int. Cl.
*H01L 29/76* (2006.01)
(52) U.S. Cl. .................... 257/382; 257/384; 257/412; 257/411; 257/410

(58) Field of Classification Search ................ 257/382, 257/384, 388, 412, E51.044, E21.168
See application file for complete search history.

(56) References Cited

U.S. PATENT DOCUMENTS 4,803,539 A    2/1989  Psaras et al.

(Continued)

FOREIGN PATENT DOCUMENTS

DE    100 39 327 A1    2/2002

(Continued)

OTHER PUBLICATIONS

Design and Implementation of a VLSI Cordic Processor, by Yze-Yun Sung, Tai-Ming Parng, 1986 IEEE International Symposium on Circuits and Systems (Cat. No. 86CH2255-8) New York, NY, USA, pp. 934-935 vol. 3, Conference: San Jose, CA, USA, May 5-7, 1996.

(Continued)

*Primary Examiner*—Thao P. Le
(74) *Attorney, Agent, or Firm*—Ware, Fressola, Van Der Sluys & Adolphson LLP

(57) ABSTRACT

The invention relates to a method for the selective silicidation of contact areas that allow the production of highly integrated circuits, preferably in a SMOS or BiCMOS process. To this end, a metal oxide layer (14) that contains for example praseodymium oxide is deposited onto a prepared wafer (12). A silicon layer (16) and on top of said silicon layer a cover layer (18) is deposited onto the metal oxide layer (14), said cover layer being laterally structured. In a subsequent tempering step in an oxygen-free, reducing gas atmosphere the silicon layer (16) and the metal oxide layer (14) are converted to a metal silicide layer in lateral sections (20, 22) in which the cover layer (18) was previously removed.

10 Claims, 4 Drawing Sheets

U.S. PATENT DOCUMENTS

| | | | | |
|---|---|---|---|---|
| 4,916,508 | A | * | 4/1990 | Tsukamoto et al. .......... 257/385 |
| 5,221,853 | A | * | 6/1993 | Joshi et al. .................. 257/384 |
| 6,100,173 | A | | 8/2000 | Gardner et al. |
| 6,191,059 | B1 | * | 2/2001 | Varanasi ....................... 501/70 |
| 6,458,678 | B1 | * | 10/2002 | Spikes et al. ............... 438/592 |
| 6,548,877 | B2 | * | 4/2003 | Yang et al. .................. 257/382 |
| 7,060,600 | B2 | * | 6/2006 | Mussig ........................ 257/310 |
| 2005/0212030 | A1 | * | 9/2005 | Mussig ........................ 257/310 |

FOREIGN PATENT DOCUMENTS

| | | |
|---|---|---|
| EP | 0 048 849 A2 | 9/1981 |
| EP | 0 171 003 | 7/1985 |
| EP | 0 407 202 A2 | 7/1990 |
| EP | 1 094 514 A2 | 4/2001 |

OTHER PUBLICATIONS

Generalized CORDIC for Digital Signal Processing, by Lee & Morf, Ch. 1746-7/82/0000-1748 00.75 1982 IEEE, pp. 1748-1751.

Redundant CORDIC Methods with a Constant Scale Factor for Sine and Cosine Computation, by Naofumi Takagi, Tohru Asada, and Shuzo Yajima, IEEE Transactions on Computers, vol. 40, No. 9, Sep. 1991, pp. 989-995.

Double Step Branching CORDIC: A New Algorithm for Fast Sine and Cosine Generation, by Dhananjay S. Phatak, IEEE Transactions on Computers, vol. 47, No. 5, May 1998, pp. 587-602.

Hybrid CORDIC Algorithms, by Shaoyun Wang, Vincenzo Piuri, Earl E. Swartzlander, IEEE Transactions on Computers, vol. 46, No. 11, Nov. 1997, pp. 1202-1207.

Redundant and On-Line CORDIC: Application to Matrix Triangularization and SVD, Milos D. Ercegovac, and Tomas Lang, IEEE Transactions on Computers, vol. 39, No. 6, Jun. 1990, pp. 725-740.

XP-001022227, A unified algorithm for elementary functions, by J.S. Walther, Hewlett Packard Co., Spring Joint Computer Conference, 1971, pp. 379-385.

Discrete Basis and Computation of Elementary Functions, by Jean-Michel Muller, IEEE Transactions on Computers, vol. C-34, No. 9, Sep. 1985, (pp. 857-862).

A VLSI array architecture for realization of DFT, DHT, DCT and DST, by K. Maharatna, A.S. Dhar, Swapna Banerjee, Signal Processing 81 (2001) pp. 1813-1822. (www.elsevier.com/locate/sigpro), , 2001 Elsevier Science B.V.

A VLSI array architecture for Hough transform, by K. Maharatna, Swapna Banerjee, 2001 Pattern Recognition Society, (www.elsevier.com/locate/patcog), published by Elsevier Science Ltd., (pp. 1503-1512).

Multiplierless Array Architecture for Computing Discrete Cosine Transorm, by Manik Chandra Mandal, Anindya Sundar Dhar and Swapna Banerjeet, Computers Elect. Engng vol. 21, No. 1, pp. 13-19, 1995 Copyright 1994, Elsevier Science Ltd.

A Pipelined Computer Architecture for Unified Elementary Function Evaluation, by Michael Andrews and Daniel A. Eggerding, Comput. & Elect. Engng vol. 5, pp. 189-202, Pergamon Press Ltd., 1978.

Complex Arithmetic Through CORDIC, by S. Hitotumatu, Kodai Math. Sem. Rept. 26 (1975), pp. 176-186, received Jun. 4, 1973.

The CORDIC Trigonometric Computing Technique, by Jack E. Volder, IRE Transactions on Electronic Computers, Sep. 1959, pp. 330-334.

VLSI Implementation of Rotations in Pseudo-Euclidean Spaces, by Jean-Marc Delosme, Information Systems Laboratory, Stanford Univ., CA, pp. 927-930, CH1841-6/83/0000-0927, 1983 IEEE .

Algorithms and Accuracy in the HP-35, A lot goes on in that little machine when it's computing a transcendental function, by David S. Cochran, pp. 10-11, Hewlett-Packard Journal (Jun. 1972) vol. 23, No. 10, pp. 10-11.

Very Fast Fourier Transform Algorithms Hardware for Implementation, by Alvin M. Despain, IEEE Transactions on Computers, vol. C-28, No. 5, May 1979, pp. 333-341.

High-k Gate Dielectrics with Ultra-low leakage current based on praseodymium oxide; H.J. Osten, et al; Im Technologiepark; IEEE 2000.

Salicides and alternative technologies for future ICs: Part 1; Jorge A. Kittl, et al; Texas Instruments Inc.; Dallas, TX. Jun. 1999; Solid State Technology; pp. 81-92.

Salicides and alternative technologies for future ICs: Part 1; Jorge A. Kittl, et al; Texas Instruments Inc.; Dallas, TX. Aug. 1999; Solid State Technology; pp. 55-62.

* cited by examiner

TRANSISTOR, METHOD FOR PRODUCING AN INTEGRATED CIRCUIT AND A METHOD OF PRODUCING A METAL SILICIDE LAYER

CROSS REFERENCE TO RELATED APPLICATIONS

This application is for entry into the U.S. national phase under §371 for International Application No. PCT/EP02/05773 having an international filing date of May 24, 2002, and from which priority is claimed, and which in turn claims priority from German patent Application No. DE 101 55 915.1 filed on Nov. 12, 2001, and from German Patent Application No. DE 101 27 234.0 filed on May 26, 2001.

TECHNICAL FIELD

The invention concerns a transistor having a metal silicide-bearing contact region between a semiconductor region and a metallically conducting region. The invention further concerns a method of producing an integrated circuit on a substrate, in which a metal silicide-bearing contact region is produced on a silicon surface in one or more lateral portions. Finally the invention concerns a method of producing a metal silicide layer on a substrate with a silicon surface.

BACKGROUND OF THE INVENTION

Highly integrated memory and logic circuits as well as circuits for data transmission at high speed are based on MOS-transistors which are produced by means of a CMOS or BiCMOS-technology.

Advances in the direction of a further increase in integration density of circuits require the implementation of devices of extremely small dimensions in respect of electronically active regions and extremely shallow transitions in the electronic band structure. For the coming years the 'International Technology Roadmap for Semiconductors', Semiconductor Industries Association, 1999, requires a reduction in the lateral structures of integrated circuits of below 70 nanometres (nm) and a reduction in the effective gate oxide thickness of MOS-transistors of below 1 nanometre. At the present time however no satisfactory solutions with which those technological demands can be fulfilled are known in the area of conventional silicon technology.

The implementation of structures of reduced dimensions is not possible with the material $SiO_2$ (silicon oxide, silicon dioxide) used hitherto as the gate oxide, as high tunnel currents occur with the required gate oxide thicknesses of below between 1 and 2 nm. High tunnel currents result in poor power data in respect of finished circuits. Inter alia they reduce the gain factors which can be achieved, increase the power loss and involve a high level of noise. The search is therefore on for alternative gate oxide materials with a high dielectric constant. Besides materials such as aluminum oxide, zirconium oxide and hafnium oxide, praseodymium oxide is also being tried (H-J Osten et al, Technical Digest IEDM 2000, page 653).

Gate structures for MOS-transistors of memory and logic circuits which are being produced nowadays or which are under development involve a layer structure. The thin gate oxide layer directly adjoins the Si-substrate. A gate electrode generally consisting of polycrystalline silicon (polysilicon, poly-Si) is deposited on the gate oxide layer. A contact region is additionally provided between the gate electrode and conductor tracks which are generally made from aluminum. The contact region includes one or more silicides of refractive metals such as for example tungsten (W), molybdenum (Mo), tantalum (Ta) or titanium (Ti) or suicides of transition metals such as cobalt (Co), platinum (Pt); nickel (Ni) etc. Typical gate contact structures which are used nowadays have a layer sequence $WSi_x$/poly-Si/$SiO_2$, $CoSi_x$/poly-Si/$SiO_2$ or $TiSi_x$/poly-Si/$SiO_2$, in the direction from the contact region to the gate oxide.

The contact regions provide for low-resistance contacting of source and drain areas in MOS-transistors and a reduction in the bulk resistance of gate electrodes and conductor tracks of polysilicon. They serve at the same time as a diffusion barrier for preventing damaging alloy formation between the semiconducting material (for example silicon) and the metallically conductive material of the conductor tracks.

Suicides of Ti, Co, Pt or Ni are preferably also used in contact regions in relation to monocrystalline silicon, for example the source and drain regions of an MOS-transistor or the base, emitter or collector region of a bipolar transistor, see J A Kittl et al 'Salicides and Alternative Technologies for Future ICs', Solid State Technology, June 1999, 81 ff and Solid State Technology, August 1999, 55 ff.

In known production methods for highly integrated circuits, to produce self-adjusting contact regions, firstly the metal is deposited in surface-covering relationship on the surface of the doped and prestructured substrate. During a subsequent tempering step the formation of a highly conductive metal silicide takes place exclusively in areas in which, prior to the metal deposition, the silicon substrate was exposed and was not covered with oxide, at the contact locations between the metal and silicon. In the case of an MOS-transistor, contact regions at source, drain and gate are produced in that way.

A disadvantage of that method is that then the metal has to be removed in expensive etching and cleaning steps, in the areas in which no silicide was formed.

SUMMARY OF THE INVENTION

The object of the invention is to provide a transistor and a method of producing an integrated circuit, which while involving simple method implementation, permit a particularly high level of integration density of devices in the integrated circuit.

That object is attained by a transistor having a metal silicide-bearing contact region between a semiconductive region and a metallically conducting region, in which the metal silicide contains praseodymium silicide.

The transistor according to the invention has high-grade contacts even with very small geometries. Praseodymium silicide has good electrical properties which even at the highest integration densities provide for low-resistance contacting. Praseodymium silicide enjoys high conductivity and at the same time prevents the diffusion and alloy formation between the materials of the semiconductive and the metallically conductive region. With suitable process implementation it is possible to produce praseodymium silicide-containing contact regions easily and of reliably high quality. Therefore praseodymium silicide is particularly well suited for use as material which is additional or alternative, in comparison with conventional materials, in contact regions of a transistor. Praseodymium silicide can also be used in contact regions of other semiconductor devices such as for example diodes.

The contact region of the transistor according to the invention is of a substantially layer configuration, as in conventional transistors. However it does not necessarily involve a dimension which is large—in comparison with its thickness—in (lateral) directions perpendicular to the sequence of semiconducting region, contact region and metallically conducting region. Subsequent structuring, self-adjusting production methods or suitable adjustment of the production parameters, for example in epitaxial production methods, make it possible to produce in electronic devices structures whose lateral dimension is of the order of magnitude of the thickness of the contact region.

The contact region of the transistor according to the invention is arranged between a region made from semiconductor material and a metallically conductive region. Such an arrangement can be embodied in various ways. The material contact between the region of the semiconductor material, the contact region and the metallically conductive region can extend to a point, a line or an area. For low-resistance contacting, there is preferably areal contact in each case between the contact region and the semiconducting region and the metallically conductive region respectively. In that case the contact region can also be embedded in the region of the semiconductor material or in the metallically conductive region. It is essential that the contact region does not permit any material contact between the region of the semiconductor and the metallically conductive region in order to avoid alloy formation of the semiconductor with the material of the metallically conductive region.

The region of the semiconductor material is preferably electrically semiconducting (semiconductive), but it can also be degenerated by suitably highly concentrated doping, that is to say adapted to be metallically conductive.

The metallically conductive region typically contains aluminum, but it may also contain silver or copper.

The contact region of the transistor according to the invention in preferred embodiments adjoins a silicon region. This can be monocrystalline, as is the case with source and drain areas of MOS-transistors or base, emitter and collector areas of bipolar transistors. The semiconducting silicon region however may also be polycrystalline, as is usually the case for example with the material of the gate electrode of MOS-transistors.

Preferably the contact region entirely consists of praseodymium silicide. Further embodiments of the transistor according to the invention additionally contain one or more suicides of a lanthanide, zirconium or hafnium, in the contact region, besides praseodymium silicide.

The semiconductor device according to the invention generally has a plurality of contact regions. In the case of an MOS-transistor these are the contact regions of source, drain and gate, while in the case of a bipolar transistor they are the contact regions of emitter, collector and base. Other semiconductor devices according to the invention may have more or fewer contact regions. Not all contact regions have to contain praseodymium silicide. Where appropriate to improve the economy of process implementation, a contact region may also have no praseodymium silicide. In the case of an MOS-transistor, because of the possibility of particularly simple process implementation which will be further discussed hereinafter, the contact regions of the source and the drain preferably have praseodymium silicide. The gate electrode may here contain praseodymium silicide but it may also entirely consist of another silicide such as titanium silicide. Alternatively solely the gate electrode may have a contact region with praseodymium silicide while the contact regions at source and drain contain another silicide.

In further embodiments of the transistor according to the invention the contact region involves a lateral extent of less than 200 nm. The transistor according to the invention however is particularly suited to highly integrated circuits with lateral structure dimensions of less than 100 nm. Contact regions with praseodymium silicide can be formed with lateral structure dimensions of markedly below 100 nm, as will be required for future technologies. Contact regions with praseodymium silicide, while affording good electrical properties, offer homogeneity and temperature stability which are sufficiently high for modern technologies.

The embodiment of the transistor according to the invention, which is preferred at the present time, is an MOS-transistor. Here the praseodymium silicide-bearing contact region affords the greatest advantages by virtue of its compatibility with production methods for very highly integrated circuits with lateral structure dimensions of below 100 nm. Such MOS-transistors have gate oxide layer thicknesses in the region of 1 nm and less.

In a preferred embodiment of an MOS-transistor according to the invention the gate oxide comprises praseodymium oxide $Pr_2O_3$ or $Pr_6O_{11}$, preferably $Pr_2O_3$. Praseodymium oxide $Pr_2O_3$ has a high dielectric constant of $K_{eff}=31+-3$, which is independent of the doping of the substrate, and can be produced in the predominantly crystalline phase. It is additionally distinguished by an extremely low leakage current density which are reduced in comparison with comparable dielectrics such as $ZrO_2$ and $HfO_2$ by a factor of between about $10^{-4}$ and $10^{-5}$. Further advantages of this material are its great resistance at high process temperatures and stressing of the crystal lattice. By virtue of those properties praseodymium is particularly suitable as a dielectric in a predominantly crystalline phase, for scaled electronic devices with scaling factors which exceed previous values.

MOS-transistors with praseodymium oxide as the gate dielectric and praseodymium silicide in the contact region are distinguished in that they can be produced in a simple procedure and thus particularly economically. That process forms an independent concept of the invention and is discussed in detail hereinafter. Therewith the gate oxide and the contact regions of source and drain can be produced at the same time. Hereinafter, only the essential features of the method will be briefly set forth, to clearly show the advantage of this embodiment of the transistor according to the invention. In the context of the procedure for the production of an integrated circuit, a praseodymium oxide layer is deposited on a prepared substrate which preferably has doped source and drain areas. A silicon layer is then deposited on the praseodymium oxide layer and a cover layer is in turn deposited on the silicon layer. The cover layer is then removed in a step of the lateral structuring over the areas of source and drain so that the silicon layer is exposed there. In a subsequent tempering step in an oxygen-free, preferably reducing gas atmosphere or in a vacuum, the lateral portions, which are not covered by the cover layer, of the silicon layer and the praseodymium oxide layer—in particular therefore over the source and drain areas—are converted into praseodymium suicide while, in the lateral portions covered by the cover layer—in particular therefore in the region of the gate—they are not converted. In that way the gate oxide and contact regions at the source and the drain are produced simultaneously in only a few process steps. An argon atmosphere is considered as the oxygen-free gas atmosphere while a hydrogen atmosphere is considered as the oxygen-free, reducing gas atmosphere.

Just like the contact region of the transistor according to the invention can additionally contain suicides of other metals, the gate oxide in the present embodiment of an MOS-transistor may also contain a mixed oxide with additional oxides of other metals, in particular lanthanides or hafnium.

In such an MOS-transistor the gate oxide layers with praseodymium oxide are of a layer thickness of between 3 and 50 nm. Preferably layer thicknesses for the gate oxide layer of between 10 and 30 nm are used.

The above-depicted advantages of the transistor according to the invention are particularly markedly apparent in the case of MOS-transistors because of the simple process implementation and the possibility of particularly high scaling in integrated circuits. In that case also, in relation to bipolar transistors, the contact regions of base, emitter and collector may contain praseodymium silicide and in principle can be produced in the same simple fashion.

In regard to a second, independent, aspect of the invention, the above-specified object is attained by a method of producing an integrated circuit on a substrate, in which a metal silicide-bearing contact region is produced on a silicon surface in one or more lateral portions, and which comprises the following steps:

depositing a layer of a metal oxide on the silicon surface,
depositing a silicon layer on the metal oxide layer,
depositing a cover layer on the silicon layer,
removing the cover layer in one or more lateral portions, and
tempering the substrate in an oxygen-free, preferably reducing gas atmosphere.

The method according to the invention permits common selective production of metal silicide-bearing structural elements and metal oxide-bearing structural elements of an integrated circuit in few steps. Metal silicide-bearing structural elements preferably form contact regions while metal oxide-bearing structural elements, depending on the respective arrangement in the integrated circuit, can perform many different functions, for example as a gate oxide for insulating the gate from the substrate, as a field oxide for setting a high threshold voltage outside the active areas, as an intermediate oxide for the insulation of polysilicon from aluminum or as a protective oxide for the passivation of the surface.

The method according to the invention is based on a novel procedure for the formation of a metal silicide on a silicon surface, which represents a concept of the invention involving independent patentability. Conventional methods of siliciding a metal cannot be applied for the formation of a metal silicide from a metal oxide. In the procedure according to the invention a metal silicide is formed by reduction of a metal oxide embedded in silicon. For that purpose, firstly a layer of an oxide of the metal is deposited on a silicon surface of a substrate. A silicon layer is then deposited on the metal oxide layer. Finally the substrate is tempered in an oxygen-free, preferably reducing gas atmosphere. The oxygen-free gas atmosphere involved is for example an argon atmosphere, while a hydrogen atmosphere is the preferred oxygen-free, reducing gas atmosphere. During that tempering operation the silicon layer, the metal oxide layer and as far as a certain depth also the silicon surface of the substrate are converted into a homogeneous metal silicide layer which is firmly joined to the substrate.

That process is further developed by the method according to the invention for the production of an integrated circuit in order to permit selective silicide formation (siliciding) in predetermined lateral portions of the metal oxide layer. To prepare for selective siliciding, in the method according to the invention for the production of an integrated circuit, a cover layer is deposited on the silicon layer and then laterally structured. In that case, the cover layer is removed from the silicon layer in the lateral portions in which siliciding is to take place. It is only thereafter that the step of tempering in an oxygen-free, preferably reducing gas atmosphere—for example an argon atmosphere or preferably a hydrogen atmosphere—is carried out. A vacuum is also interpreted in this context as a gas atmosphere. In the lateral portions covered by the cover layer, the metal oxide is retained during the tempering step while the above-described siliciding effect takes place in the lateral portions which are not covered thereby. After the tempering step the metal silicide forms the substrate surface in the lateral portions not covered by the cover layer.

Selective siliciding of that kind can be effected at different stages in the production of the integrated circuit, depending on the respective structural elements which are precisely to be formed. The method according to the invention is particularly suitable for the selective formation of the gate oxide layer from the metal oxide and the contact regions of source and drain by formation of the metal silicide from the metal oxide. However the formation of a gate contact region in a later stage in the production of the integrated circuit can also be effected with the method according to the invention.

The method according to the invention permits silicide formation with laterally high selectivity. The lateral resolution of siliciding of the metal oxide is limited predominantly by the smallest lateral dimensions which can be achieved in respect of the openings in the cover layer. Lateral transistor geometries of less than 50 nm can be readily achieved at the present time with the production method according to the invention.

Etching and cleaning steps which are required with known methods of the general kind set forth and with which, in the context of the production of self-adjusting contact regions, deposited material has to be removed again from the other lateral portions of the substrate surface, can be eliminated in the method according to the invention or are only required in a reduced number. The metal oxide layer portions which remain after the tempering operation outside the electrically active regions can be retained for other functions, for example as a field oxide. Alternatively they are removed in a subsequent step.

Basically electrically insulating metal oxides, including mixtures of such metal oxides, are suitable for carrying out the method according to the invention. A further selection condition for the metal oxide is that a silicide of the same metal has good electrical conductivity. The deposition of a layer of the metal oxide and the conversion thereof into the metal silicide must be possible at temperatures of less than 1100° C. in order to avoid destroying the previously prepared structures of the integrated circuit by the diffusion of doping agents out of the doping areas.

Preferably, metal oxides with a high dielectric constant are used in order to be able to produce integrated circuits with small dimensions in terms of their devices. Besides the preferred praseodymium oxide, for example oxides of further rare earth metals, the lanthanides, titanium as well as zirconium oxide and hafnium oxide or mixed oxides of those components are suitable.

Besides the advantages already referred to above, praseodymium oxide has the advantage that it is a sufficiently frequently occurring material which is also used in the glass industry, in catalysis and for ferroelectric storage media and can therefore be obtained at low cost.

The substrate tempering step is preferably effected in a hydrogen-bearing gas atmosphere, in particular a pure hydrogen atmosphere, in order to permit reduction of the metal oxide.

In a further embodiment of the method according to the invention the substrate tempering step is carried out in a vacuum. The gas pressure of the vacuum should be at a value which is usual for microelectronics technology, for example between $10^{-3}$ and $10^{-7}$ Pa, preferably between $10^{-5}$ and $10^{-6}$ Pa.

The temperature which obtains in the substrate tempering step should be between 650° C. and 1100° C. when using praseodymium oxide. In the region of a temperature of 650° C., siliciding takes place at relatively low speed and requires a long tempering procedure over several hours up to a day. As mentioned above, above a temperature of 1100° C., there is the threat of destroying the prepared structures. Preferably the substrate tempering step is carried out at a temperature of between 700° C. and 800° C. That ensures on the one hand the stability of the prepared structures while on the other hand achieving economically appropriate tempering periods.

The period of time over which the tempering step is effected is inter alia dependent on the set temperature and on the layer thickness of the silicon layer over the metal oxide layer. Tempering periods can therefore range from between a few seconds up to several hours. Preferably tempering periods of between 10 and 50 minutes, in particular 30 minutes, are used.

In an embodiment for the production of a praseodymium silicide layer from a praseodymium oxide layer with the method according to the invention, the silicon substrate tempering step takes place over a period of 60 minutes at a temperature of 700° C. in a vacuum with a gas pressure of $7\times10^{-6}$ Pa.

The step of depositing the metal oxide layer on the silicon surface can be effected by means of a physical or chemical deposition method from the gaseous phase. Details in respect of the possible methods of depositing a praseodymium oxide layer are described in the present applicants' application DE 100 39 327.6. In particular epitaxial growth of the metal oxide layer can be achieved by the choice of suitable method parameters in gaseous phase epitaxy.

The layer thickness to be deposited, when using the metal oxide as the gate oxide, is dependent on the dielectric constant of the metal oxide. A praseodymium oxide layer provided as the gate oxide is deposited in a layer thickness of between 3 and 50 nm. Preferably layer thicknesses of between 10 and 30 nm are used for very high integration.

The step of depositing the silicon layer on the metal oxide layer can be effected by means of any known technology. Preferably the silicon layer is deposited out of the gaseous phase by means of chemical gaseous phase epitaxy (Chemical Vapour Deposition). The deposited silicon layer can be amorphous, polycrystalline or monocrystalline, for carrying out the method according to the invention.

The thickness of the silicon layer over the metal oxide layer should be between 5 and 50 nm. Excessively great layer thicknesses prevent the complete reduction of the metal oxide. When forming praseodymium silicide layers from praseodymium oxide, silicon layers of a layer thickness of between 10 and 30 nanometers have proven their worth.

In a preferred embodiment of the method according to the invention the step of depositing the silicon layer on the praseodymium oxide layer is effected immediately after the step of depositing the praseodymium oxide layer. In that respect contact of the substrate with ambient air is preferably avoided.

A metal, a semiconductor or an insulator can be used as the material of the cover layer. In a particularly simple method the metal of the cover layer is also silicon. That affords the possibility of applying the silicon layer and the cover layer to the metal oxide in one deposition step and then, using conventional structuring methods, removing the cover layer in the lateral portions provided for silicide formation. Alternatively it is also possible for insulators such as silicon nitride or silicon oxide to be deposited as the cover layer.

If the material of the cover layer is silicon then the temperature stability of the praseodymium oxide layer under the cover layer is correspondingly greater, the thicker the cover layer is. The temperature stability of the praseodymium oxide layer under the cover layer of silicon can be further increased by the tempering operation being carried out in a reducing nitrogen atmosphere.

The method according to the invention is intended primarily for use in the context of a CMOS or BiCMOS process for the production of integrated circuits and permits the implementation of very highly integrated memory and logic circuits as well as circuits for mobile telecommunications. The method according to the invention can also be used in bipolar technologies, for example for the production of transistor contacts of bipolar transistors.

BRIEF DESCRIPTION OF THE DRAWINGS

Two embodiments are described hereinafter by way of example with reference to the drawing in which.

DETAILED DESCRIPTION

Figure 1:
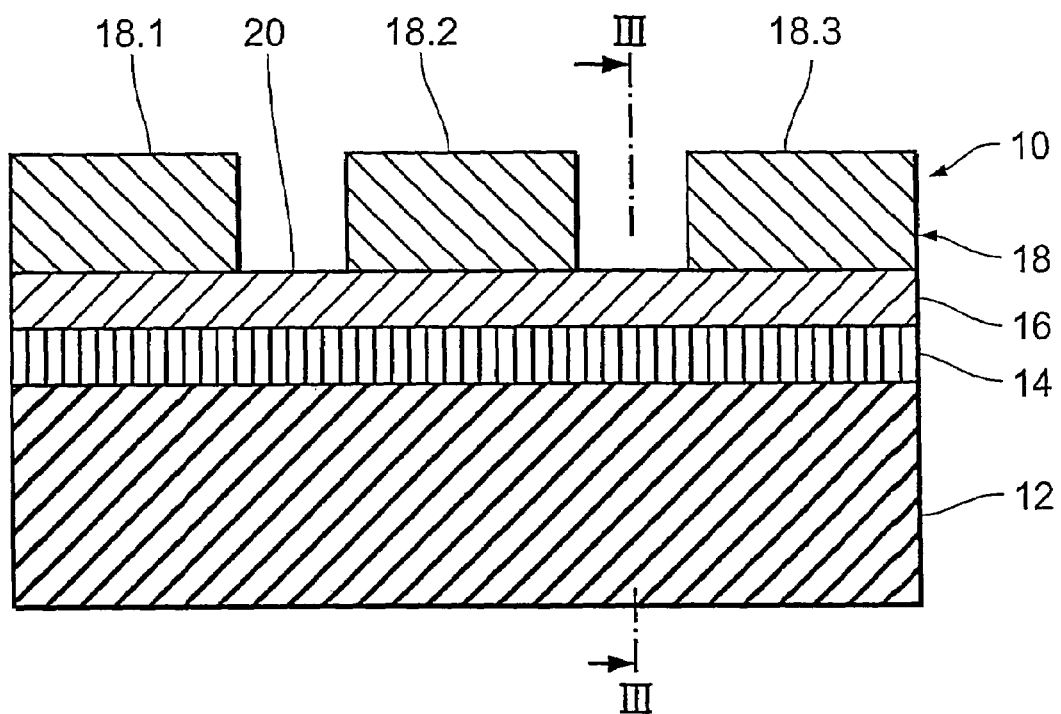
FIG. 1 is a simplified view in section of an embodiment of an MOS-transistor during production, prior to the tempering step in a reducing, oxygen-free gas atmosphere.

FIG. 1 shows a simplified view in section through an embodiment of an MOS-transistor 10 during production thereof, more specifically prior to the tempering step in a reducing, oxygen-free gas atmosphere. A silicon wafer 12 is preprepared for integrated CMOS or BiCMOS-circuits and in the region illustrated in FIG. 1 laterally selectively provided with the required implantations for the implementation of an MOS-transistor and its source and drain contacts. Corresponding details which fully correspond to the present state of the art are omitted from FIG. 1 for the sake of simplicity of the drawing.

A praseodymium oxide layer 14 is deposited on the wafer surface. The thickness thereof is uniform in the lateral direction and is between 10 and 30 nanometres. Deposited on the praseodymium oxide layer 14 is a silicon layer 16 whose layer thickness in the lateral direction is also uniform and is between 10 and 30 nanometres. Three cover layer portions 18.1, 18.2, 18.3 of a cover layer 18 are applied to the silicon layer. After the removal of cover layer parts between the cover layer portions 18.1 and 18.2, as well as 18.2 and 18.3, silicon layer portions 20 and 22 of the silicon layer 16 are exposed. The exposed silicon layer portions 20 and 22 are arranged over the doping areas (not identified here) of the source and the drain in the wafer 12.

Figure 2:
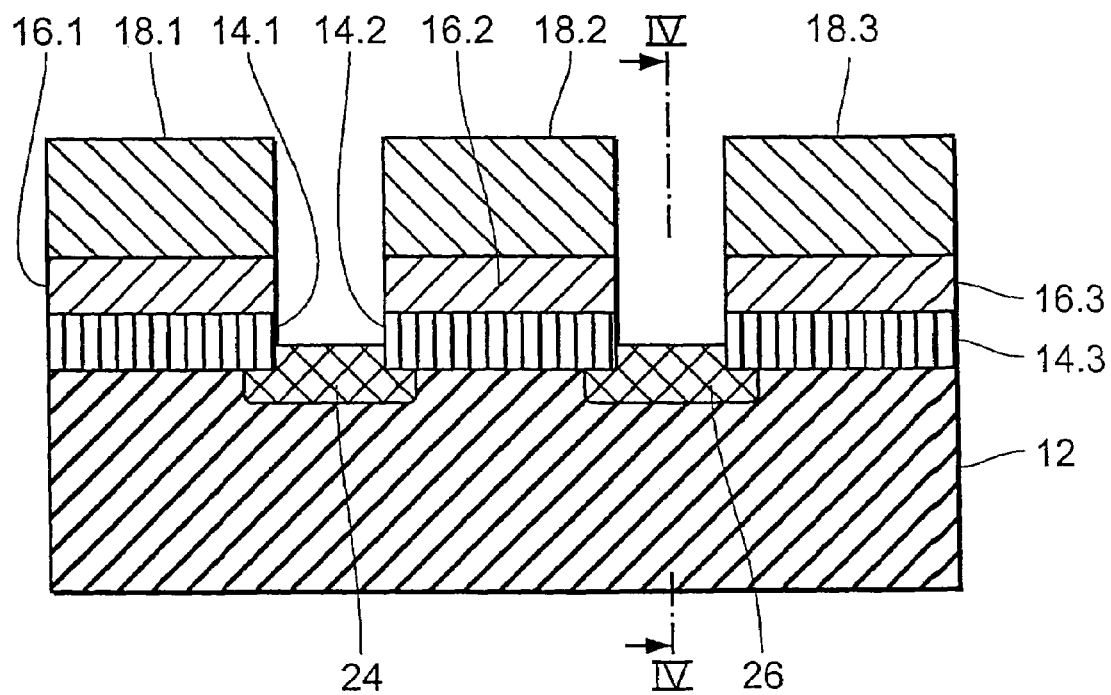
FIG. 2 is a simplified view in section of the same embodiment after the tempering step in a reducing, oxygen-free gas atmosphere.

FIG. 2 shows the same MOS-transistor in a later stage in the method, more specifically after the tempering step in a reducing, oxygen-free gas atmosphere. Here the same references identify the same structural elements as in FIG. 1. During the tempering step, in the exposed layer portions 20 and 22, the silicon layer 16 and the praseodymium oxide layer 14, together with portions of the silicon wafer 12 which are near the surface, are converted into contact regions 24 and 26 of praseodymium silicide. The contact regions 24 and 26 produced in that way are distinguished by good contact performance in relation to the silicon of the wafer 12. Silicon layer portions 16.1 through 16.3 which are arranged under the cover layer portions 18.1 through 18.3 and praseodymium oxide layer portions 14.1 through 14.3 are also obtained after the tempering step. The praseodymium oxide layer portion 14.2 forms the gate oxide layer of the MOS-transistor 10.

The gate electrode and the gate contact are produced in subsequent process steps. By using suitable masks, it is also possible to produce the gate contact with a praseodymium silicide contact region. In a later step in the method, a metallically conductive contact material, for example aluminum, is deposited (not shown here) on the contact regions 24 and 26 which are self-adjustingly produced in that way.

Figure 3:
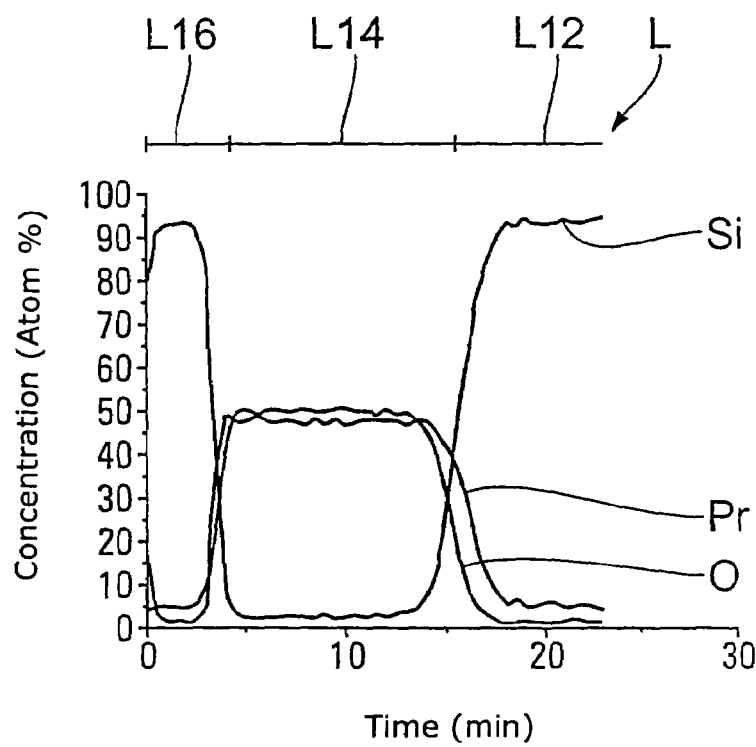
FIG. 3 shows an element depth profile recorded by means of Auger electron spectroscopy, along a line III-III in FIG. 1.

FIG. 3 is a diagram showing element depth profiles for the elements oxygen O, praseodymium Pr and silicon Si, which were recorded on the MOS-transistor structure 10. The element depth profiles were recorded approximately along the line III—III in FIG. 1 by means of Auger electron spectroscopy (AES). The sputtering time in minutes during recording of the element depth profile is plotted on the abscissa. With an increasing sputtering time, deeper layers of the MOS-transistor structure along the line III—III in FIG. 1 are exposed. The energy of the Auger electrons which are emitted by the atoms which are detached from the wafer in the sputtering operation is continuously analysed and used to identify the atoms which have been sputtered off. The concentration of the elements Si, Pr and O in atomic percent (atom %), which was ascertained from the signal intensity in various energy ranges, is plotted on the ordinate axis of the diagram in FIG. 3.

A line L illustrated above the diagram, on the basis of the subdivision thereof, shows the essential results which are discussed hereinafter. The subdivision shows which regions of the element depth profiles are to be associated with which layer of the structure in FIG. 1. The subdivision of the line, on the basis of the limited depth resolution of the measurement procedure, can only show the approximate position of the interfaces between the layers 12 and 14, and 14 and 16 respectively. A line portion marked by L16 extends above the portion of the abscissa in which the element depth profile was recorded in the region of the silicon layer 16. In a corresponding fashion, a line portion L14 shows the profile region of the praseodymium oxide layer 14 and a line portion L12 shows the profile region of the silicon wafer 12.

The element depth profile in the region of the silicon layer 16, besides a markedly predominant proportion of silicon, near the surface, firstly shows a proportion of oxygen which is at 20 atomic percent and which rapidly decreases with increasing depth in the direction of the praseodymium oxide layer 14. This points to a thin silicon oxide layer on the surface. In the region L14, virtually no silicon can be detected, but only oxygen and praseodymium, as is to be expected for the praseodymium oxide layer. In the region L12 the levels of concentration of oxygen and praseodymium fall rapidly with increasing depth, as is to be expected, as it is here that the silicon wafer is analysed.

Figure 4:
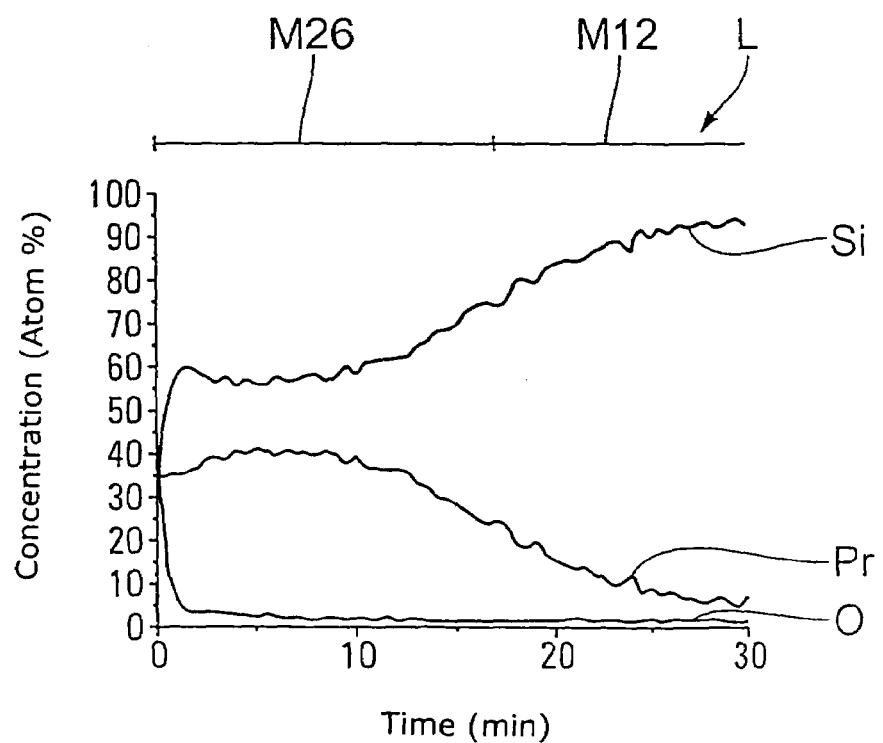
FIG. 4 shows an element depth profile recorded by means of Auger electron spectroscopy, along a line IV-IV in FIG. 2.

FIG. 4, for comparison with FIG. 3, shows an element depth profile in respect of the elements O, Pr and Si of the same structure 10 after the tempering step at 700° C. over a period of 60 minutes in a vacuum of about $7 \times 10^{-6}$ Pa. The element depth profile was recorded approximately along the line IV—IV in FIG. 2. It can be clearly seen that oxygen is only still contained in a narrow region near the surface, which again is to be explained by the formation of a thin silicon oxide layer. Therebeneath, almost exclusively praseodymium and silicon are contained in a portion M26 which corresponds to the contact region 26. The silicon layer 16 and the praseodymium oxide layer 14 have been converted into a complete praseodymium silicide layer. The oxygen which is disadvantageous in terms of conductivity of the contact has diffused out. This shows that the above-described method can be successfully used to produce praseodymium silicide-bearing contact regions which are suitable for very highly integrated circuits.

In an embodiment of the method according to the invention polycrystalline silicon, referred to for brevity as polysilicon, is applied as the cover layer 18. That kind of cover layer is referred to hereinafter as the Si-cover layer. Producing the cover layer in the form of the Si-cover layer affords the advantage that the silicon layer 16 and the cover layer 18 can be applied in a single method step, in the form of a single layer, referred to hereinafter as the overall Si-layer. In the subsequent structuring operation, the overall Si-layer is removed down to a residual thickness of between 10 and 30 nanometres, in the regions in which silicide is to be formed.

In the subsequent tempering step, in the regions in which the overall Si-layer has been removed to the thickness of between 10 and 30 nanometres, praseodymium silicide is formed, as described above. In the other regions in which the overall Si-layer has not been removed, the praseodymium oxide layer 14 is protected from suicide formation by the overall Si-layer.

Tests have shown that a polysilicon layer as the cover layer 18, besides the stated advantages, further affords the advantage that the temperature stability of the praseodymium oxide layer 14 is increased in other tempering steps. The thicker the polysilicon layer is, the correspondingly longer is the period for which the praseodymium oxide layer 14 is temperature-stable.

The praseodymium oxide is present in the praseodymium oxide layer 14 in particular either in a polycrystalline, predominantly crystalline or monocrystalline phase. In this respect the reference to predominantly crystalline is intended to mean that the praseodymium oxide is present in a polycrystalline phase with large monocrystalline regions. In the specified cases an amorphous intermediate layer is formed at the transition from a monocrystalline silicon substrate to the praseodymium oxide. In accordance with knowledge hitherto, that amorphous intermediate layer predominantly comprises an amorphous mixture of praseodymium and silicon oxide. If the intermediate layer becomes wider during the tempering operation, that results in a worsening of the electrical properties of the praseodymium oxide layer, in particular the dielectric constant thereof. The parameters of the tempering step, for example temperature and duration of the tempering operation, the nature of the atmosphere and the thickness of the cover layer, are preferably so selected that the amorphous intermediate layer is not or is only slightly widened by the tempering operation. That applies not only for the situation where the material of the cover layer 18 is polysilicon but also for the situation where the material of the cover layer 18 is metal.

Figure 5:
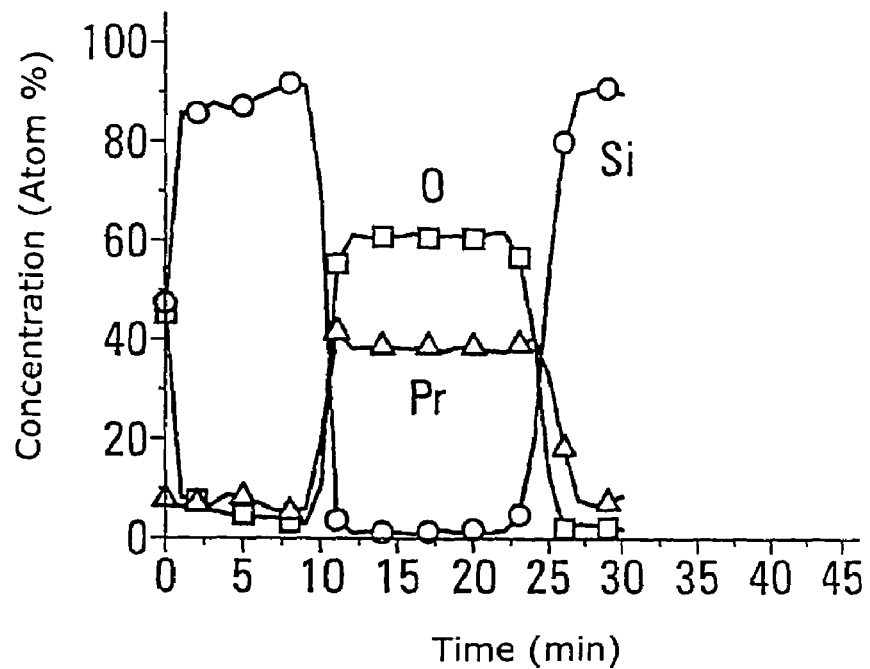
FIG. 5 shows an element depth profile recorded by means of Auger electron spectroscopy with a silicon layer which is thicker in comparison with the profile shown in FIG. 3.
Figure 6:
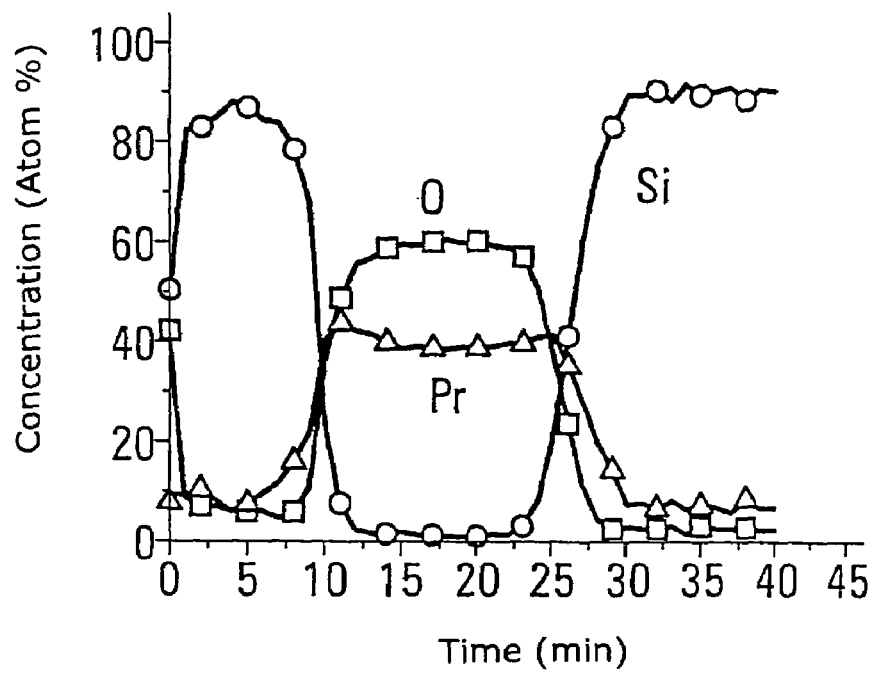
FIG. 6 shows the element depth profile from FIG. 5 after a tempering step.

FIG. 5 shows a diagram corresponding to FIG. 3, but with a silicon layer which is thicker relative to the praseodymium oxide layer 14 and which is deposited over the praseodymium oxide layer 14. FIG. 6 shows the element depth profile from FIG. 5 after tempering for one hour. The tempering operation was carried out under the same conditions as tempering of the structure shown in FIG. 3. It can be seen from FIG. 6 that the tempering operation has left the praseodymium oxide layer almost completely intact. No silicon has penetrated into the praseodymium oxide layer 14 and only the transitions between the layers appear to be slightly widened in relation to the structure prior to the tempering step.

The temperature stability of the praseodymium oxide layer 14 can be further enhanced by performing the tempering operation in a hydrogen-bearing nitrogen atmosphere. Instead of the hydrogen-bearing nitrogen atmosphere it is also possible to use other reducing nitrogen atmospheres.

Figure 7:
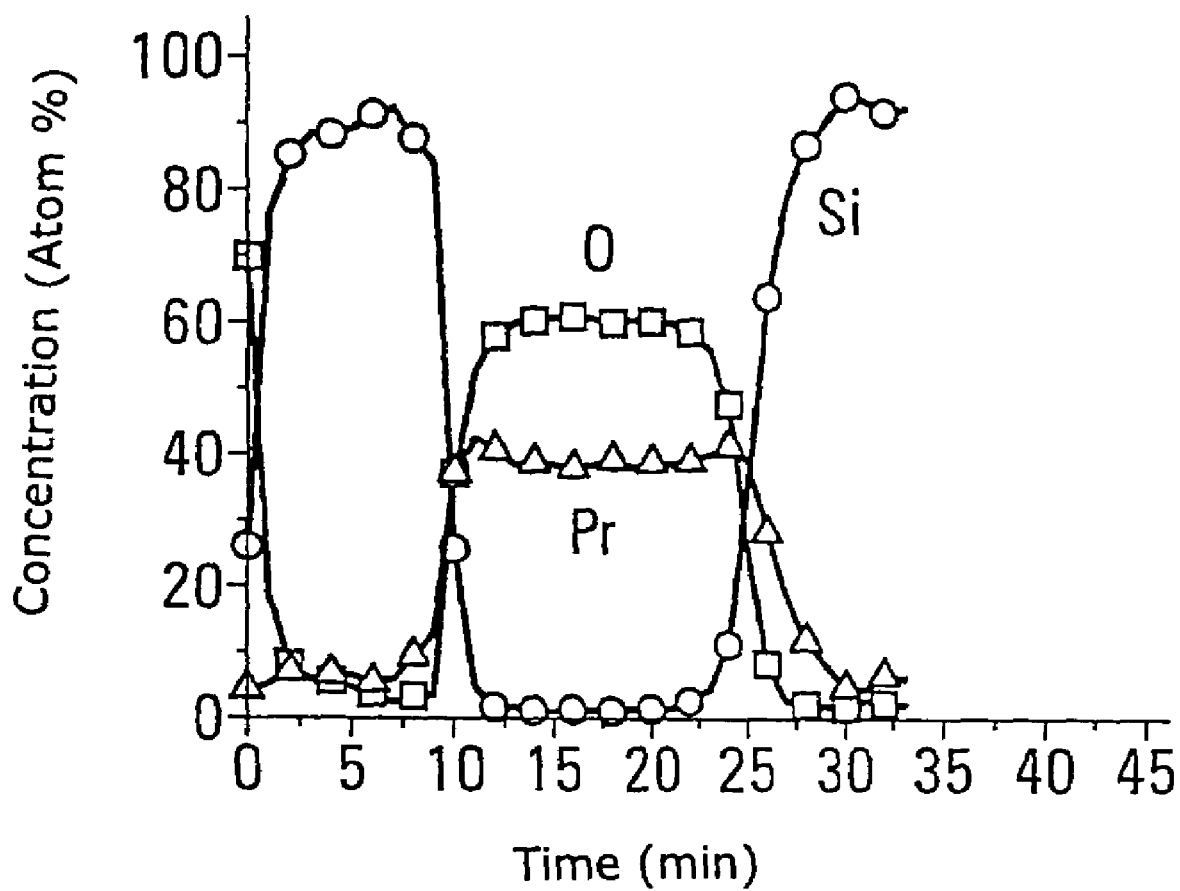
FIG. 7 shows the element depth profile from FIG. 5 after a tempering step in a nitrogen atmosphere.

FIG. 7 shows a structure, as is illustrated in FIG. 5, after it has been tempered at 800° Celsius for three hours in a nitrogen atmosphere. The element depth profile recorded after the tempering step is practically identical to the element depth profile shown in FIG. 5 prior to tempering. If in contrast the tempering step is not effected in a nitrogen atmosphere, serious changes are already to be found in the praseodymium oxide layer after tempering for two hours at 700° Celsius, and in particular an increase in the width of the transitions to the adjacent layers.

The invention claimed is:

1. A transistor (10), comprising: metal silicide-bearing contact region (24, 26) between a semiconductive region (12) and a metallically conductive region, wherein the metal silicide contains praseodymium silicide, and wherein the transistor (10) further comprises a gate electrode having a gate oxide layer (14.2) between the semiconductive region (12) and a portion (16.2) of a silicon layer (16), characterised in that the gate oxide layer (14.2) contains praseodymium oxide.

2. A transistor according to claim 1 characterised in that the contact region (24, 26) adjoins a semiconducting silicon region (12).

3. A transistor according to claim 1 characterised in that the contact region (24, 26) has a lateral extent of less than 200 nm or less than 100 nm.

4. A transistor according to claim 1 characterised in that the contact region (24, 26) additionally contains a metal silicide of the lanthanide group.

5. A transistor according to claim 1 characterised in that the contact region (24, 26) additionally contains a silicide of zirconium or hafnium.

6. A transistor according to claim 1 characterised in that it is in the form of an MOS-transistor (10).

7. A transistor according to claim 1 characterised in that the gate oxide layer (14, 14.2) is of a layer thickness of between 3 and 50 nm.

8. A transistor according to claim 7 characterised in that the gate oxide layer (14, 14.2) is of a layer thickness of between 10 and 30 nm.

9. A transistor according to claim 1 characterised in that it is in the form of a bipolar transistor.

10. The transistor of claim 1, wherein the metal-suicide bearing contact region containing praseodymium silicide is formed by depositing a layer (14) of praseodymium oxide on a silicon surface of a substrate forming the semiconductive region (12), depositing the silicon layer (16) on the praseodymium oxide layer (14), and tempering the substrate (12) in a reducing gas atmosphere that is optionally oxygen-free.

* * * * *

UNITED STATES PATENT AND TRADEMARK OFFICE
CERTIFICATE OF CORRECTION

PATENT NO. : 7,196,382 B2
APPLICATION NO. : 10/479300
DATED : March 27, 2007
INVENTOR(S) : Dietmar Krüger et al.

It is certified that error appears in the above-identified patent and that said Letters Patent is hereby corrected as shown below:

In column 2, line 3, delete "suicides" and substitute --silicides--.
In column 2, line 16, delete "suicides" and substitute --silicides--.
In column 3, line 44, delete "suicides" and substitute --silicides--.
In column 4, line 57, delete "suicides" and substitute --silicides--.
In column 4, line 66, delete "suicides" and substitute --silicides--.
In column 10, line 43, delete "suicides" and substitute --silicides--.
In column 12, line 30, claim 10, line 1, delete "suicides" and substitute --silicides--.

Signed and Sealed this

Eighteenth Day of September, 2007

JON W. DUDAS
*Director of the United States Patent and Trademark Office*